United States Patent

[11] 3,612,958

[72] Inventors Takeshi Saito; Hasegawa Fumio, both of Tokyo, Japan

[21] Appl. No. 857,411
[22] Filed Sept. 12, 1969
[45] Patented Oct. 12, 1971

[73] Assignee Nippon Electric Company, Limited Tokyo, Japan

[32] Priority Sept. 14, 1968
[33] Japan
[31] 43/65915

[54] GALLIUM ARSENIDE SEMICONDUCTOR DEVICE
2 Claims, 2 Drawing Figs.

[52] U.S. Cl. .......... 317/234 R, 317/235 R, 317/234 V, 317/235 AM, 317/235 AQ, 148/175, 148/191
[51] Int. Cl. .......... H01l 3/00
[50] Field of Search .......... 317/234, 235, 235 (31), 235 (48.1), 235 (48.2), 235 (48.3), 235 (48.4); 148/33, 33.1, 174, 75, 191

[56] References Cited

UNITED STATES PATENTS

| | | | |
|---|---|---|---|
| 3,530,014 | 9/1970 | Antell .......... | 148/187 |
| 3,523,046 | 8/1970 | Grochowski et al. .......... | 148/175 |
| 3,244,950 | 4/1966 | Ferguson .......... | 317/235 |
| 3,421,952 | 1/1969 | Conrad .......... | 148/175 |

*Primary Examiner*—John W. Huckert
*Assistant Examiner*—B. Estrin
*Attorney*—Sandoe, Hopgood & Calimafde

ABSTRACT: A gallium arsenide semiconductor device comprises a low resistivity substrate having a high impurity concentration. A first high impurity concentration layer is grown on the substrate and a second, low impurity layer is grown on the first grown layer. The introduction of impurities from the substrate into the grown semiconductor layer is significantly decreased.

INVENTORS
TAKESHI SAITO
FUMIO HASEGAWA
BY
Sandoe, Hopgood & Calimafde
ATTORNEYS

GALLIUM ARSENIDE SEMICONDUCTOR DEVICE

This invention relates generally to semiconductor devices, and particularly to semiconductor devices made of gallium arsenide and having a staircaselike concentration distribution gradient.

BACKGROUND OF THE INVENTION

Techniques for fabricating semiconductor devices utilizing vapor epitaxial growth are known. For example, epitaxial Schottky barrier diodes are manufactured by depositing a low-impurity-density N-type semiconductor layer at least $1\times10^{11}$ ohm-cm. in resistivity and a few microns in thickness over a high-impurity-concentration N-type semiconductor substrate of not more than $1\times10^{13}$ ohm-cm. in resistivity through a vapor epitaxial growth process. Subsequent to this process, a metal film is deposited through a vacuum evaporation process, thereby forming the Schottky barrier.

It is known, however, that the growth of such a lightly doped semiconductor layer of low-impurity density on the heavily doped, high-impurity-density semiconductor substrate by a vapor epitaxial growth process often leads to the introduction of an undesirably high impurity concentration into the grown semiconductor layer. As this layer is required to have low impurity concentration, this relatively high concentration adversely affects the operating characteristics of the resultant semiconductor device.

OBJECT OF THE INVENTION

The object of the present invention is to provide a semiconductor device made of gallium arsenide in which the introduction of impurities from the substrate into the grown semiconductor layer during the course of vapor growth is minimized.

BRIEF SUMMARY OF THE INVENTION

According to the present invention, a gallium arsenide semiconductor device is provided comprising a gallium arsenide low resistivity substrate having a high impurity concentration, a first gallium arsenide layer grown on the substrate containing a high impurity concentration without autodoping, and a second gallium arsenide layer grown on the first grown layer containing low impurity concentration.

To the accomplishment of the above and such further objects as may hereinafter appear, the present invention relates to a novel gallium arsenide semiconductor device and a method for making same, as defined in the appended claims and as described in the following specification, taken together with the accompanying drawing, in which:

FIG. 1 is a graphical presentation of the impurity distribution profiles of a gallium arsenide device of the prior art and of the present invention; and FIG. 2 shows a schematic view of an embodiment of a gallium arsenide semiconductor device fabricated according to the present invention.

DETAILED DESCRIPTION OF THE INVENTION

In a typical vapor growth technique utilizing the disproportionation reaction of the arsenic trichloride-gallium-hydrogen system, an N-type gallium arsenide substrate having a resistivity of $1\times10^{13}$ ohm-cm. is placed in a reaction furnace such as a lateral-type furnace employing nickel-chrome heater elements. A source gallium is maintained at a temperature of 850° C. while the substrate is maintained at 750° C. Hydrogen gas is then supplied in the form of bubbles at the rate of 300 ml. per minute through arsenic trichloride cooled at 0° C. A semiconductor layer of N-type gallium arsenide having a resistivity of $1\times10^{11}$ ohm-cm, is thus grown on the substrate at a rate of 0.2 micron per minute for a period of 40 minutes.

Figure 1:
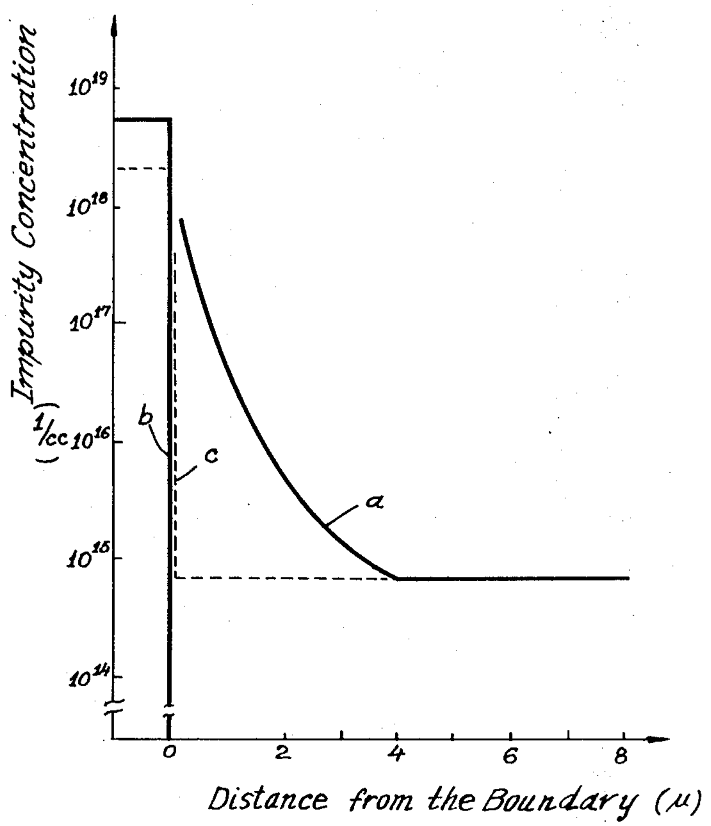

The impurity concentration profile of the N-type gallium arsenide semiconductor layer prepared by the vapor epitaxial process as a function of the distance from the interface between the substrate and the semiconductor grown layer is shown by curve (*a*) in FIG. 1, in which a gentle drop and a very high impurity concentration up to a distance of about 4 microns from the substrate-grown layer interface is clearly shown.

This is attributed to the diffusion of the impurities from the semiconductor substrate into the grown semiconductor layer through the interface caused by the heating of the semiconductor substrate to elevated temperatures during the course of the vapor growth. If this factor is solely responsible for the impurity diffusion, then the impurity concentration distribution should be approximately represented by the solid line (*b*) in FIG. 1. It follows, therefore, that this factor is not the direct cause of the impurity distribution illustrated in curve (*a*). Another factor responsible for this is the phenomenon known as autodoping, by means of which the impurity once driven out of the substrate gains entrance into the vapor-grown layer. This is considered as the basic cause of the impurity concentration distribution as represented by curve (*a*) in FIG. 1.

Introduction of a large amount of impurities into the substrate for the above-mentioned and other reasons involves a number of disadvantages undesirable for the design of semiconductor elements. Among those disadvantages is the difficulty in controlling the impurity concentration in the grown layer as originally designed and, also, the drop in the breakdown voltage of Schottky barrier diodes formed in the manner described. Furthermore, although the breakdown voltage is increased by depositing a relatively thick semiconductor layer by a vapor-growth process this is done at the loss of significant performance characteristics such as the reduction of the cutoff frequency caused by the increase of the resistance.

In the vapor-growth process utilizing the disproportionation reaction of an arsenic trichloride-gallium-hydrogen system by an open tube method, the autodoping or out-diffusion of the impurities from substrate into the grown layer produces serious drawbacks. Vapor growth, particularly the disproportionation reaction, is inevitably associated with the undesirable autodoping. However, the degree of the autodoping that occurs varies with the type, concentration and other characteristics of the impurities in the substrate. For example, if both the semiconductor substrate and the grown layer are gallium arsenide, with tellurium, sulfur, selenium, and the like contained in the substrate, a fairly large amount of impurities in the substrate gains entrance into the grown layer by autodoping. However, if the impurity in the substrate is tin, germanium, silicon, or the like, autodoping is not caused and the region of high impurity concentration in the grown layer formed by the impurities out-diffused from the substrate is limited to the depth of 0.1 micron or less from the interface.

It follows therefore that, in order to avoid autodoping, tin, germanium, or silicon should be used as impurities for the substrate. However, from the viewpoint of resistivity, a gallium arsenide substrate containing tin, germanium silicon or the like as the impurity presents great difficulty in limiting the resistivity to a value not greater than $1\times10^{13}$ ohm-cm. even if the impurity is used in a large amount. In contrast, a gallium arsenide substrate containing tellurium, sulfur, selenium or the like as the impurity can have resistivity values below that level.

In accord with the present invention, gallium containing a suitable amount of metallic tin is employed as the source and epitaxial growth is carried out on the substrate of gallium arsenide containing the high concentration of tellurium as the impurity. A grown layer having a high concentration of tin as the impurity is obtained. The impurity distribution of the resultant layer having a high impurity concentration is such that tellurium is contained in high concentration through the autodoping up to the depth of approximately 4 microns from the surface of the substrate, and that tin is contained in high concentration in the region of the grown layer of approximately 4 microns or more deep from the surface of the substrate.

The substrate formed with the grown layer is employed as a substrate and the vapor growth is carried out by the disproportionation reaction, and the intrusion of any appreciable amount of impurity from the substrate into the newly grown layer is prevented.

Thus, it is possible in accordance with the present invention to obtain a semiconductor crystal of sufficiently low substrate resistivity and with an extremely low degree of autodoping or out-diffusion. Such a crystal is ideal for use in the fabrication of a gallium arsenide Schottky barrier diode or a gallium arsenide varactor diode having a high cutoff frequency over 300 GHz.

The fabrication of the semiconductor device of the present invention is described with reference to the following examples.

The first step involves the vapor growth of a layer of high impurity concentration using tin as the impurity. Source gallium (25 g.) with the addition of high purity metallic tin (5 g.) is placed, together with a substrate containing tellurium as the impurity and having a resistivity of $1\times10^{13}$ ohm-cm., in a reaction tube. The source and substrate temperatures are set at 850° C. and 750° C., respectively, and a stream of hydrogen is bubbled at a rate of 200 ml. per minute through arsenic trichloride cooled at 0° C., so that a layer is grown on the substrate at the growth rate of 0.24 microns per minute for a period of 50 minutes.

Figure 2:
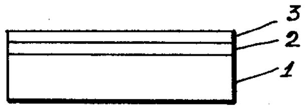

Next, the vapor growth of a layer of low impurity concentration is described, in which 25 grams of the source gallium is used and the substrate is prepared in the manner described above. Vapor growth is carried out at the rate of 0.21 micron per minute for 50 minutes. A semiconductor structure as shown in section in FIG. 2 is thus completed. In the figure, the reference numeral 1 denotes a substrate containing a high concentration of tellurium as the impurity. The numeral 2 is a grown layer containing a high concentration of tin as the impurity, and 3 is a grown layer having a low impurity concentration.

The impurity distribution measured as to the semiconductor grown layer of gallium arsenide prepared in the manner described above is shown by the curve (*c*) in FIG. 1. It is thus possible to limit the region of the high impurity concentration to a distance of not greater than 0.1 micron from the interface between the substrate and the semiconductor grown layer.

While a procedure for minimizing the intrusion of the impurity from the interface into the grown layer has been described, it should be understood that the distribution of the impurity concentration in the grown layer 3 of the low impurity concentration can be controlled to any desired shape within the ranges illustrated by curves (*a*) and (*c*) in FIG. 1, by suitably decreasing the thickness of the grown layer 2 having a high impurity concentration of tin.

If the semiconductor element fabricated in this way is further processed, for example, into a Schottky barrier diode, a desirable semiconductor device is obtained which has a high breakdown voltage despite the very thin semiconductor layer formed through the vapor growth process, and which possesses a higher cutoff frequency than those of conventional devices of this type.

Although the present invention has been described above as embodied in a Schottky barrier diode, the invention is not limited thereto but is applicable as well to the fabrication of varactor diodes, Gunn diodes, LSA diodes, gallium arsenide transistors, gallium arsenide functional elements, and gallium arsenide integrated circuits comprising any such components or elements. In addition, the present invention is applicable to solution growth as well as to vapor growth of gallium arsenide.

Thus, while only a single embodiment of the present invention has been herein specifically disclosed, it will be apparent that many variations may be made therein without departing from the spirit and scope of the invention.

We claim:

1. A semiconductor device comprising a gallium arsenide substrate of low resistivity, having a high impurity concentration, the impurity in said substrate being tellurium, a first gallium arsenide layer grown on said gallium arsenide substrate, said first grown layer having high impurity concentration, the impurity in said first grown layer being tin, and a second gallium arsenide layer of a low impurity concentration grown on said first gallium arsenide grown layer.

2. The device of claim 1, in which the resistivity of said substrate is not greater than $1\times10^{13}$ ohm-cm.